United States Patent [19]
Imura

[11] Patent Number: 6,052,572
[45] Date of Patent: Apr. 18, 2000

[54] MOBILE COMMUNICATION APPARATUS

[75] Inventor: Minoru Imura, Tokyo, Japan

[73] Assignee: NEC Corporation, Tokyo, Japan

[21] Appl. No.: 08/880,154

[22] Filed: Jun. 20, 1997

[30] Foreign Application Priority Data

Jun. 26, 1996 [JP] Japan ................................. 8-165885

[51] Int. Cl.⁷ .................. H03F 1/18; H03H 1/20
[52] U.S. Cl. ............. 455/343; 455/38.3; 455/571; 455/572; 340/825.44
[58] Field of Search .................. 455/343, 38.3, 455/127, 571, 572; 340/825.44

[56] References Cited

U.S. PATENT DOCUMENTS

| | | | |
|---|---|---|---|
| 4,890,332 | 12/1989 | Takahashi | 455/67.3 |
| 5,487,176 | 1/1996 | Yoneyama | 455/67.1 |
| 5,797,090 | 8/1998 | Nakamura | 455/234.1 |
| 5,805,989 | 9/1998 | Ushida | 455/343 |
| 5,842,121 | 11/1998 | Norimatsu | 455/343 |
| 5,870,680 | 2/1999 | Guerlin et al. | 455/557 |

FOREIGN PATENT DOCUMENTS

| | | |
|---|---|---|
| 52-120704 | 10/1977 | Japan . |
| 61-78423 | 5/1986 | Japan . |
| 62-281529 | 12/1987 | Japan . |
| 63-153634 | 10/1988 | Japan . |
| 4-354210 | 12/1992 | Japan . |
| 5-022210 | 1/1993 | Japan . |
| 5-63624 | 3/1993 | Japan . |
| 6-70336 | 9/1994 | Japan . |
| 7-212297 | 8/1995 | Japan . |
| 8-18500 | 1/1996 | Japan . |

*Primary Examiner*—Daniel S. Hunter
*Assistant Examiner*—Alan Gantt
*Attorney, Agent, or Firm*—Young & Thompson

[57] ABSTRACT

A mobile communication apparatus includes an amplification circuit, a power supply section, a signal conversion section, a detector, and a control section. The amplification circuit amplifies a received radio signal to output an RF-amplified signal. The power supply section supplies power to the RF amplification circuit. The signal conversion section converts one of the RF-amplified signal and the received radio signal from the RF amplification circuit into an intermediate frequency signal. The detector detects the IF signal output from the signal conversion section. The control section detects the reception sensitivity of the received radio signal on the basis of the RF-amplified signal from the RF amplification circuit, and controls the supply of power from the power supply section to the RF amplification circuit and performs bypass control on the RF amplification circuit on the basis of the detected reception sensitivity and a predetermined reception sensitivity.

10 Claims, 5 Drawing Sheets

6,052,572

MOBILE COMMUNICATION APPARATUS

BACKGROUND OF THE INVENTION

The present invention relates to a mobile communication apparatus and, more particularly, to a mobile communication apparatus having a battery.

A conventional mobile communication apparatus such as a car telephone, a portable telephone, or a radio selective calling receiver uses a battery as a power supply, whose battery capacity is limited. For this reason, a digital radio apparatus or the like based on a TDMA (Time Division Multiplex Access) scheme such as the multichannel carrier scheme performs a battery saving operation to minimize the power consumption. A battery saving operation is performed as follows. In a standby state or speech communication, the reception circuit is operated only when a control signal must be received, but the supply of a current from the power supply to the reception circuit is stopped in other periods. With such a battery saving operation, the power consumption is reduced to allow the long-duration use of the apparatus.

Japanese Patent Laid-Open No. 5-22210 discloses a mobile radio communication apparatus with a long standby time. In this apparatus, when the reception electric field strength is high in a standby state, i.e., a very high reception sensitivity is not required, the reception section is controlled to lower the reception sensitivity to the required minimum reception sensitivity, thereby reducing the power consumption.

FIG. 5 shows the mobile ratio communication apparatus disclosed in this reference. A signal from a base station is received by an RF (Radio Frequency) circuit 102 of a reception section 120 through an antenna 100 and a demultiplexer 101 to be converted into a first IF (Intermediate Frequency) signal. The first IF signal is converted into a second IF signal by an IF circuit 103. The second IF signal is detected by a detector 104. The resultant signal is output to a terminal 105.

An RSSI (Received Signal Strength Indicator) circuit 107 outputs an output voltage corresponding to the amplitude of the signal output from the IF circuit 103 to a comparator 106. A reference level generating circuit 108 stores the characteristics of the RSSI circuit 107 which correspond to the reception electric field strength. The comparator 106 compares the output voltage from the RSSI circuit 107 with the output voltage from the reference level generating circuit 108, and calculates a reception electric field strength on the basis of the stored characteristics.

A control circuit 109 stores the required minimum reception sensitivity corresponding to the reception electric field strength in advance. The control circuit 109 controls the RF circuit 102 to set the required minimum reception sensitivity corresponding to the output from the comparator 106, and also performs control to correct by a change in the gain of the RF circuit 102 the characteristics stored in the reference level generating circuit 108.

Although the power consumption can be reduced to a certain degree in the above conventional mobile radio communication apparatus, a longer standby time or a longer speech communication time is required for a mobile communication system.

SUMMARY OF THE INVENTION

It is an object of the present invention to provide a mobile communication apparatus which can attain a further reduction in power consumption.

It is another object of the present invention to provide a mobile communication apparatus which can attain a reduction in reception power consumption without degrading the reception quality.

In order to achieve the above objects, there is provided a mobile communication apparatus comprising radio frequency (RF) amplification means for amplifying a received radio signal to output an RF-amplified signal, power supply means for supplying power to the RF amplification means, signal conversion means for converting one of the RF-amplified signal and the received radio signal from the RF amplification means into an intermediate frequency (IF) signal, detection means for detecting the IF signal output from the signal conversion means, and control means for detecting a reception sensitivity of the received radio signal on the basis of the RF-amplified signal from the RF amplification means, and controlling supply of power from the power supply means to the RF amplification means and performing bypass control on the RF amplification means on the basis of the detected reception sensitivity and a predetermined reception sensitivity.

DESCRIPTION OF THE PREFERRED EMBODIMENTS

The present invention will be described in detailed below with reference to the accompanying drawings.

Figure 1:
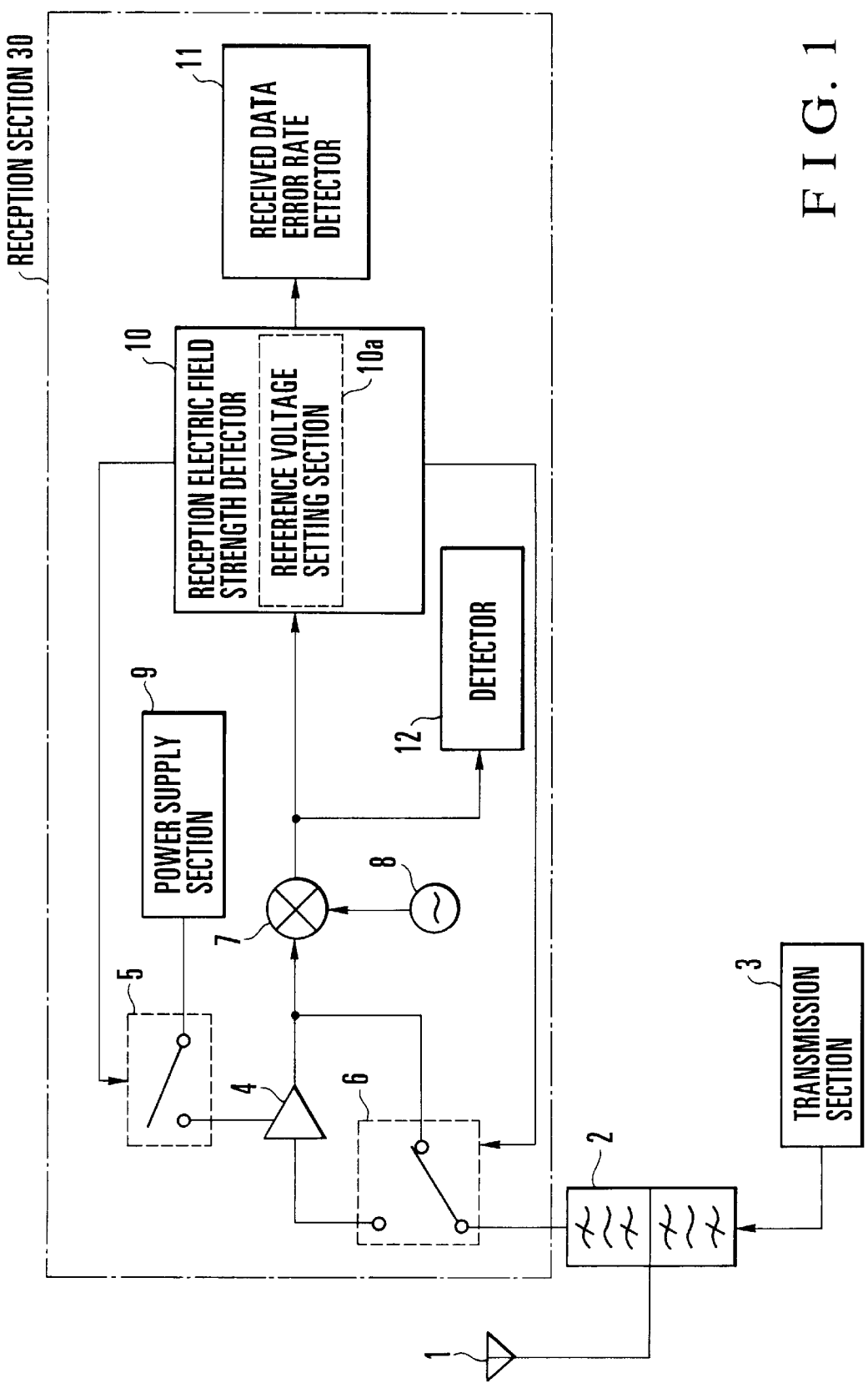
FIG. 1 is a block diagram showing a portable radio apparatus according to the first embodiment of the present invention.

FIG. 1 shows a portable radio apparatus according to an embodiment of the present invention. Reference numeral 1 denotes an antenna; 2, an RF shared unit including a demultiplexer; 3, a transmission section for transmitting a radio signal to a base station through the antenna 1 and the RF shared unit 2; and 30, a reception section for receiving a radio signal from a base station through the antenna 1 and the RF shared unit 2. The reception section 30 comprises an amplification circuit 4 for RF-amplifying a received signal from the RF shared unit 2, a power switch 5 for the amplification circuit 4, a switch 6 for turning on/off the bypass of the amplification circuit 4, a mixer 7 for mixing a received signal with a local oscillation frequency signal to output an IF signal, a local oscillator 8 for outputting the local oscillation frequency signal to the mixer 7, a power supply section 9, a reception electric field strength detector 10 for detecting a reception electric field strength on the basis of the IF signal from the mixer 7, a received data error rate detector 11 for detecting a received data error rate on the basis of the output from the reception electric field strength detector 10, and a detector 12 for detecting the IF signal from the mixer 7.

Figure 4:
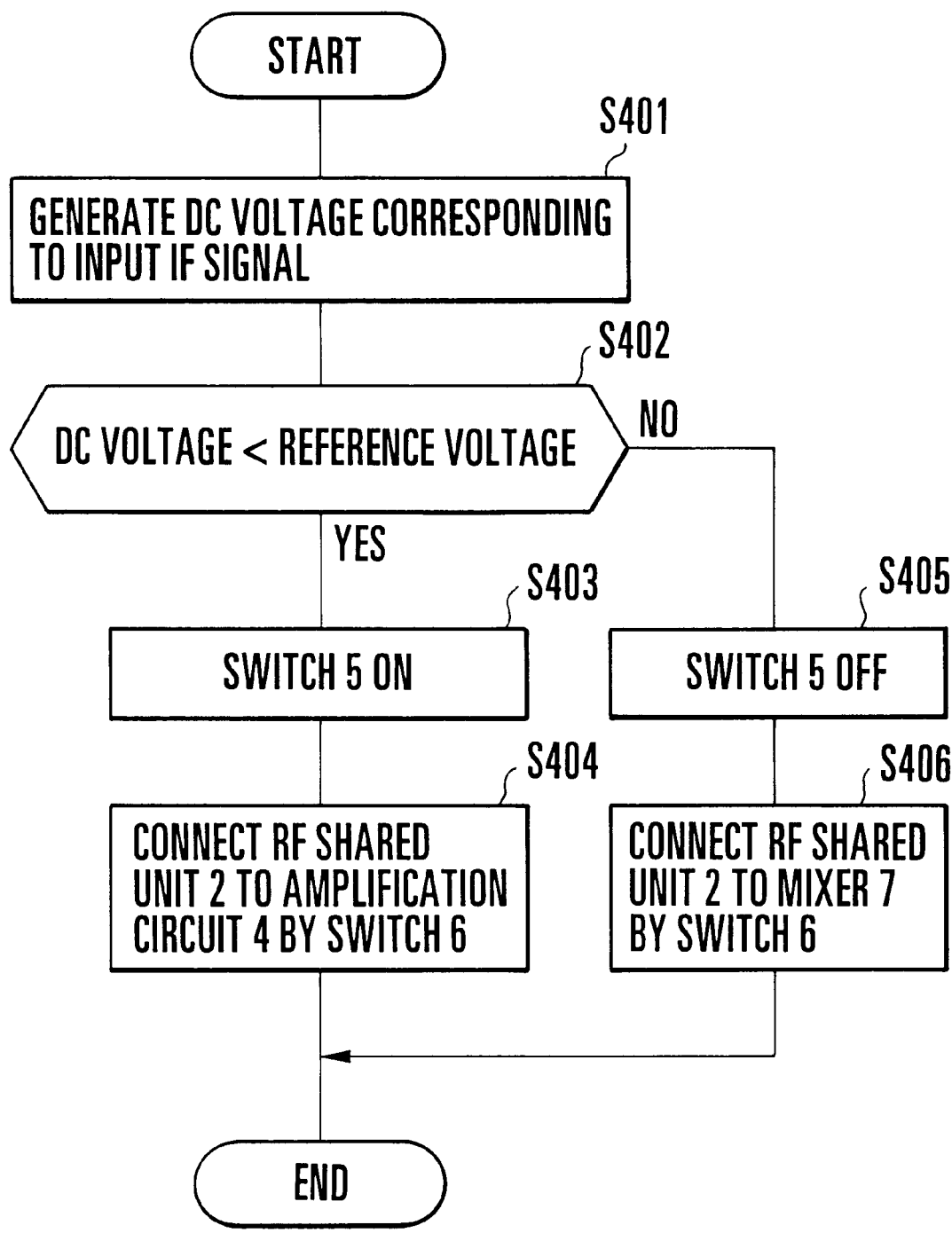
FIG. 4 is a flow chart showing the receiving operation of the portable radio apparatus in FIG. 1.
Figure 5:
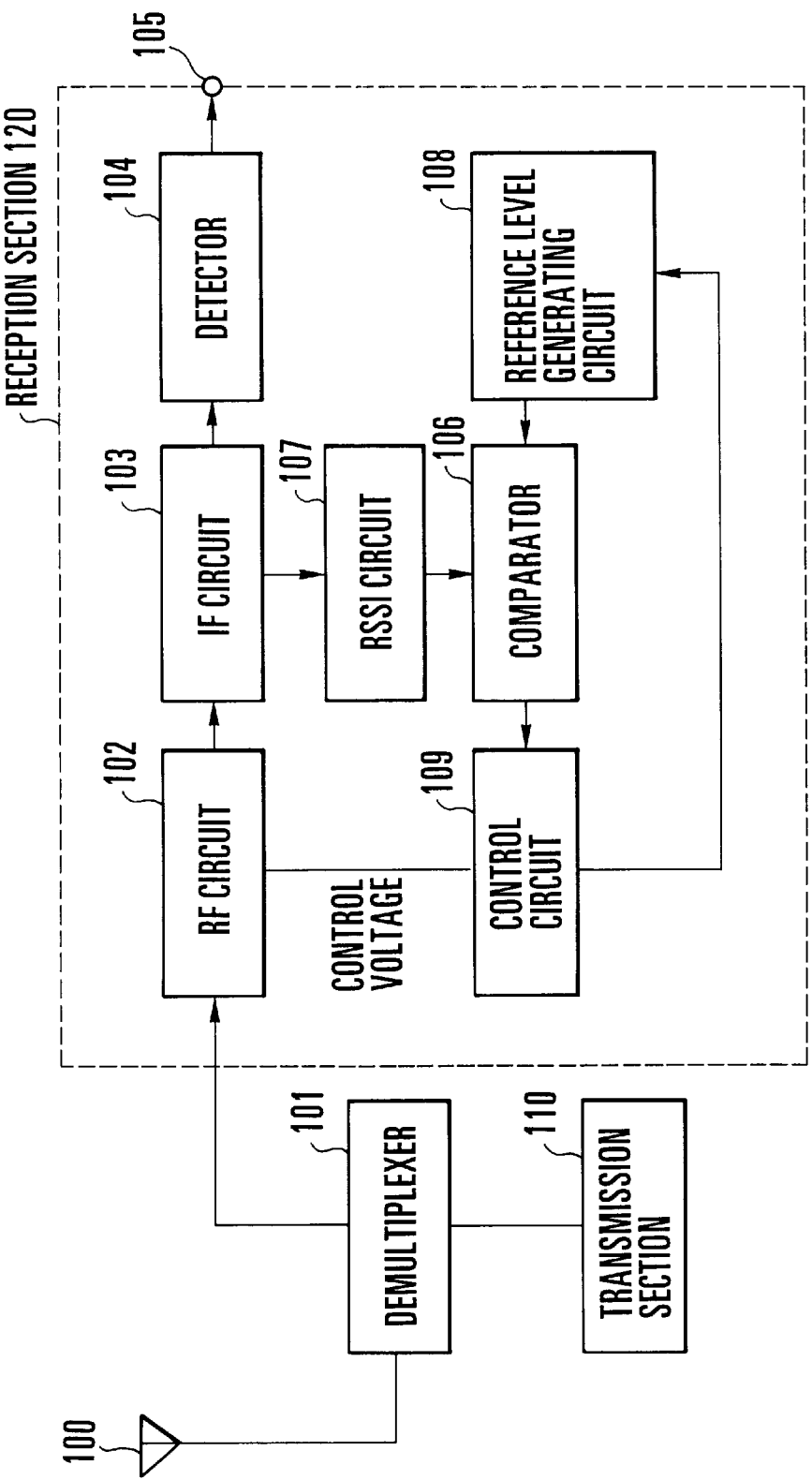
FIG. 5 is a block diagram showing a conventional mobile communication apparatus.

The receiving operation of the portable radio apparatus having the above arrangement will be described with reference to FIG. 4. A received signal from the antenna 1 passes through the RF shared unit 2 and the switch 6 and RF-amplified by the amplification circuit 4. The output signal from the amplification circuit 4 is mixed with the output signal from the local oscillator 8 by the mixer 7 to be converted into an IF signal. Thereafter, the IF signal is input to the reception electric field strength detector 10 through an amplifier and the like (not shown). The reception electric field strength detector 10 generates a DC voltage corresponding to the input level of the IF signal (step S401).

If the generated DC voltage is lower than a reference voltage level set in advance by a reference voltage setting section 10a (step S402), the reception electric field strength detector 10 controls the power switch 5 to connect the power supply section 9 to the amplification circuit 4 contrary to the state shown in FIG. 1 (step S403). The reception electric field strength detector 10 also controls the switch 6 to connect the RF shared unit 2 to the amplification circuit 4 (step S404). If the generated DC voltage is equal to or higher than the reference voltage level (step S402), the reception electric field strength detector 10 controls the power switch 5 to disconnect the power supply section 9 from the amplification circuit 4 (step S405), i.e., stops the supply of a current to the amplification circuit 4, as in the state shown in FIG. 1. The reception electric field strength detector 10 also controls the switch 6 to bypass the amplification circuit 4. With this operation, the output terminal of the RF shared unit 2 is directly connected to the input terminal of the mixer 7 (step S406).

The condition necessary to set the above reference voltage level is that a proper (allowable) received data error rate can be obtained when the supply of power to the amplification circuit 4 is stopped by the switched 5 and 6 and the amplification circuit 4 is bypassed. More specifically, it is required that a proper (allowable) received data error rate be obtained when the generated DC voltage exceeds the reference voltage level under a certain strong electric field, and the switches 5 and 6 are controlled to lower the generated DC voltage by a predetermined value (almost equal to the amplification gain of the amplification circuit 4).

The reference voltage level corresponding to the reception sensitivity and set in the reference voltage setting section 10a is the voltage level obtained by adding the voltage level corresponding to the reception sensitivity which decreases when the supply of power to the above RF amplification means is stopped, and the RF amplification means is bypassed, i.e., the voltage level corresponding to the amplification gain of the amplification circuit 4, to the voltage level corresponding to the reception sensitivity corresponding to the allowable received data error rate.

In the above manner, under a strong electric field, the amplification circuit 4 is not operated to stop the supply of a circuit current thereto. In addition, by connecting the switch 6 to the mixer 7 through a circuit characteristic impedance (about 50 Ω) line 6a, other characteristics excluding the circuit gain characteristics of the amplification circuit 4 can be maintained. At the same time, the intermodulation distortion components based on the nonlinear characteristics of the amplification circuit 4 can be reduced. As a result, spurious interference that tends to occur under a strong electric field can be prevented.

In the above embodiment, the switches are controlled depending on whether a detected reception electric field strength is equal to or higher than the predetermined reception electric field strength or lower than it. As is apparent, however, the switches may be controlled depending on whether a detected reception electric field strength is higher than the predetermined reception electric field strength or equal to or lower than it.

Figure 2:
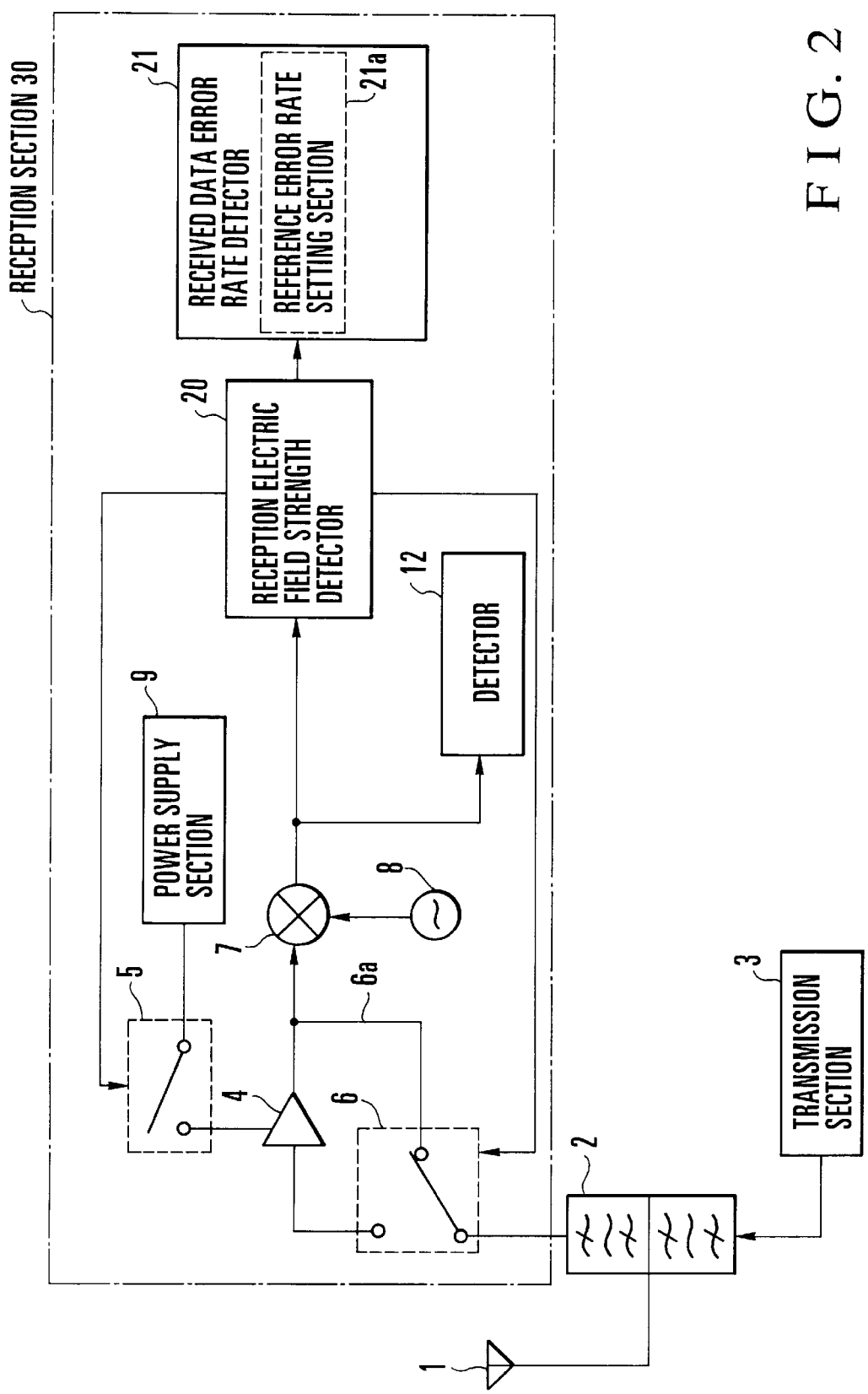
FIG. 2 is a block diagram showing a portable radio apparatus according to the second embodiment of the present invention.

FIG. 2 shows a portable radio apparatus according to the second embodiment of the present invention. The arrangement in FIG. 2 differs from that in FIG. 1 in that switches 5 and 6 are controlled by a received data error rate detector 21, instead of a reception electric field strength detector 20, using a received data error rate. Other arrangements are the same as those in FIG. 1, and a description thereof will be omitted. In this embodiment, the received data error rate detector 21 compares a detected data error rate with a reference error rate set in a reference error rate setting section 21a in advance, and performs a control operation, e.g., causing the power switch 5 to supply a current to an amplification circuit 4 or causing the switch 6 to change an RF route, in accordance with the comparison result.

Figure 3:
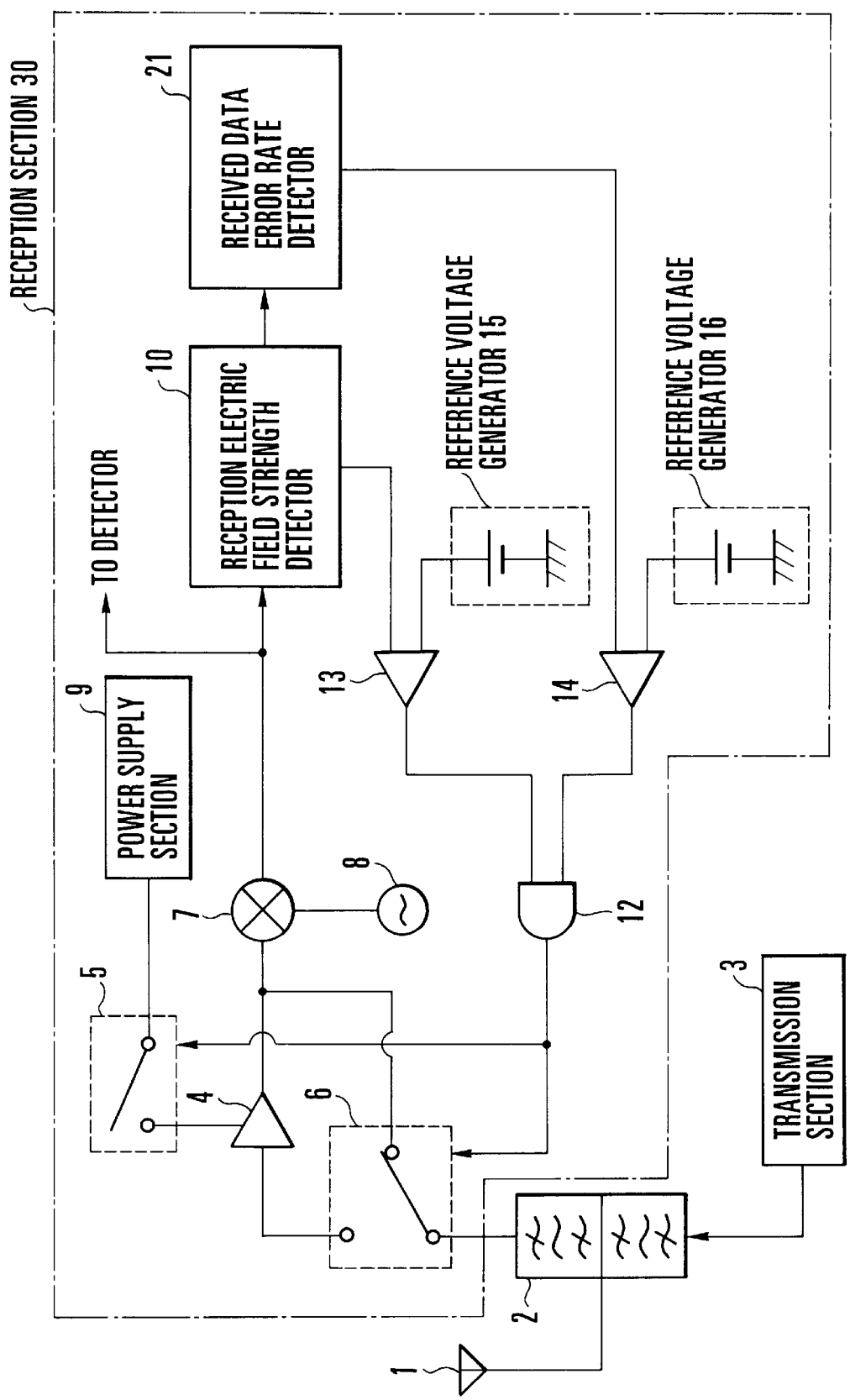
FIG. 3 is a block diagram showing a portable radio apparatus according to the third embodiment of the present invention.

FIG. 3 shows a portable radio apparatus according to the third embodiment of the present invention.

Referring to FIG. 3, switches 5 and 6 are controlled by both a reception electric field strength detector 10 and a received data error rate detector 21. In this embodiment, a comparator 13 compares the DC voltage detected and generated by the reception electric field strength detector 10 with the reference voltage generated by a reference voltage generator 15. At the same time, a comparator 14 compares the DC voltage corresponding to the data error rate output from the received data error rate detector 21 with the reference voltage generated by a reference voltage generator 16. A detector 12 receives binary signals as the comparison results obtained by the comparators 13 and 14, and performs a control operation, e.g., causing the power switch 5 to supply a current to the amplification circuit 4 or causing the switch 6 to change an RF route, in accordance with the logic levels of the two binary signals. More specifically, when both the reception electric field strength and the received data error rate become equal to or higher than the reference levels, both the comparators 13 and 14 output logic-"1" signals, and the detector 12 outputs a logic-"1" signal. With this operation, the power switch 5 is opened, and the switch 6 bypasses the amplification circuit 4.

Although each embodiment described above exemplifies the portable radio apparatus (portable telephone), the present invention can be applied to any type of mobile communication apparatus using a battery, e.g., a car telephone or a radio selective calling receiver.

As has been described above, according to the present invention, the power consumption can be reduced under a strong electric field, and the standby time and the speech communication time can be further increased. In addition, the intermodulation distortion components generated under a strong electric field can be reduced to increase the S/N ratio of a received signal.

What is claimed is:

1. A mobile communication apparatus comprising:
   radio frequency (RF) amplification means for amplifying a received radio signal to output an RF-amplified signal;
   power supply means for supplying power to the RF amplification means;
   signal conversion means for converting one of the RF-amplified signal and the received radio signal from said RF amplification means into an intermediate frequency (IF) signal;
   detection means for detecting the IF signal output from said signal conversion means; and control means for detecting a reception sensitivity of the received radio signal on the basis of the RF-amplified signal from said RF amplification means, and controlling supply of power from said power supply means to said RF amplification means and performing bypass control on said RF amplification means on the basis of the detected reception sensitivity and a predetermined reception sensitivity.

2. An apparatus according to claim 1, wherein said control means comprises reception electric field strength detection means for detecting a reception electric field strength of the received radio signal as a reception strength, supplies power from said power supply means to said RF amplification means and supplies the received radio signal to said conversion means through said RF amplification means when the detected reception electric field strength is less than a predetermined reception electric field strength, and stops supply of power from said power supply means to said RF amplification means and bypasses said RF amplification means to directly supply the received radio signal to said conversion means when the deteted reception electric field strength is greater than the predetermined reception electric field strength.

3. An apparatus according to claim 1, wherein said control means comprises received data error rate detection means for detecting a received data error rate of the radio signal as a reception strength, supplies power from said power supply means to said RF amplification means and supplies the received radio signal to said conversion means through said RF amplification means when the detected received data error rate is not less than a predetermined received data error rate, and stops supply of power from said power supply means to said RF amplification means and bypasses said RF amplification means to directly supply the received radio signal to said conversion means when the detected received data error rate is lower than the predetermined received data error rate.

4. An apparatus according to claim 1, wherein said control means comprises reception electric field strength detection means for detecting a reception electric field strength of the received radio signal as a reception strength and received data error rate detection means for detecting a received data error rate, supplies power from said power supply means to said RF amplification means and supplies the received radio signal to said conversion means through said RF amplification means when the detected reception electric field strength and the detected received data error rate are not less than a predetermined reception electric field strength and a predetermined received data error rate, respectively, and stops supply of power from said power supply means to said RF amplification means and bypasses said RF amplification means to directly supply the received radio signal to said conversion means when the detected reception electric field strength and the detected received data error rate are lower than the predetermined reception electric field strength and the predetermined received data error rate, respectively.

5. An apparatus according to claim 1, further comprising:

a first switch which is connected between said RF amplification means and said power supply means and adapted to turn on/off said power supply means from said RF amplification means; and a second switch for selectively supplying a received radio signal to one of an input terminal of said RF amplification means and an input terminal of said conversion means, and wherein said control means controls said first and second switches in an interlocking manner in accordance with a detected reception sensitivity.

6. An apparatus according to claim 5, wherein when the detected reception sensitivity is not less than a predetermined reception sensitivity, said control means controls said first switch to disconnect said RF amplification means from said power supply means, and also controls said second switch to directly supply the received radio signal to the input terminal of said conversion means.

7. An apparatus according to claim 5, wherein an output terminal of said second switch on a bypass side is connected to the input terminal of said conversion means through a circuit characteristic impedance line.

8. An apparatus according to claim 1, further comprising setting means for setting a reception sensitivity as a reference reception sensitivity, and wherein said control means performs power supply control and bypass control on said RF amplification means on the basis of the reference reception sensitivity set by said setting means and the detected reception sensitivity.

9. An apparatus according to claim 1, wherein the reception sensitivity is set by adding a reception sensitivity value which decreases when supply of power to said RF amplification means is stopped and said RF amplification means is bypassed to a reception sensitivity corresponding to an allowable received data error rate.

10. An apparatus according to claim 9, wherein the reception sensitivity is set by adding a reception sensitivity value corresponding to an amplification gain of said RF amplification means to a reception sensitivity corresponding to the allowable received data error rate.

* * * * *